United States Patent
Bhakta et al.

(10) Patent No.: US 7,944,252 B1
(45) Date of Patent: May 17, 2011

(54) HIGH PERFORMANCE LVDS DRIVER FOR SCALABLE SUPPLY

(75) Inventors: Bhavesh G. Bhakta, Richardson, TX (US); Mark W. Morgan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 12/613,202

(22) Filed: Nov. 5, 2009

(51) Int. Cl.
*H03K 3/00* (2006.01)
(52) U.S. Cl. .......................... 327/108; 327/112
(58) Field of Classification Search .............. 327/108, 327/112, 109; 326/62, 82
See application file for complete search history.

(56) References Cited

U.S. PATENT DOCUMENTS

| | | | |
|---|---|---|---|
| 6,281,715 B1 * | 8/2001 | DeClue et al. | 327/65 |
| 6,600,346 B1 * | 7/2003 | Macaluso | 327/108 |
| 6,617,888 B2 | 9/2003 | Volk | |
| 6,791,377 B2 | 9/2004 | Ilchmann et al. | |
| 6,977,534 B2 * | 12/2005 | Radelinow | 327/112 |
| 7,038,502 B2 * | 5/2006 | Yamaguchi | 327/108 |
| 7,256,626 B2 * | 8/2007 | Nguyen et al. | 327/112 |
| 7,667,502 B2 * | 2/2010 | Agarwal | 327/108 |
| 2003/0227303 A1 | 12/2003 | Ilchmann et al. | |

* cited by examiner

*Primary Examiner* — Hai L Nguyen
(74) *Attorney, Agent, or Firm* — John J. Patti; Wade J. Brady, III; Frederick J. Telecky, Jr.

(57) ABSTRACT

Traditionally, complementary metal oxide semiconductor (CMOS) and bipolar transistors have been separately employed in low voltage differential signal (LVDS) drivers. Here, a hybridized LVDS driver is provided with an input stage that uses CMOS transistors and output stages that use bipolar transistors. As a result of this hybridization, the LVDS driver has superior functional characteristics compared to conventional LVDS drivers as well as being able to function with a supply range between about 1.8V and 3.3V.

21 Claims, 2 Drawing Sheets

HIGH PERFORMANCE LVDS DRIVER FOR SCALABLE SUPPLY

TECHNICAL FIELD

The invention relates generally to low voltage differential signal (LVDS) drivers and, more particularly, to LVDS drivers that operate with supply rages between about 3.3V and about 1.8V.

BACKGROUND

LVDS drivers are commonly used with many different types of circuits, such as clocking circuitry. Looking specifically to clock products, especially those with multiple output channels, signal integrity from the LVDS drivers themselves as well as isolation of each LVDS driver from the other drivers are important. Lowering the supply voltage (1.8V, for example) would be desirable to help isolate the drivers, but drivers that operate in these voltage ranges encounter signal degradation issues (especially at high frequencies).

Turning FIG. 1, an example conventional circuit 100 employing an LVDS 102 can be seen. The driver 102 generally comprises current source 106 and complementary metal oxide semiconductor (CMOS) transistors M1 through M4. In operation, driver 102 receives complementary differential signals D and $\overline{D}$ (which are rail-to-rail signals) at the gates of transistors M1 through M4 and supplies a signal over transmission line 106 (which is terminated by resistor R1 to generally prevent line reflections) to receiver 104. Because of the use of these CMOS transistors or switches, though, amplitude degradation and noise increase with frequency, and there are significant switching transients. Another conventional alternative is to use a driver that employs bipolar transistors; however, these types of drivers generally require high voltages (typically 3.3V or greater).

Some other examples of conventional circuits are: U.S. Pat. No. 6,617,888; U.S. Pat. No. 6,791,377; and U.S. Patent Pre-Grant Publ. No. 2003/0227303.

SUMMARY

A preferred embodiment of the present invention, accordingly, provides an apparatus. The apparatus comprises a first supply rail having a voltage between about 1.8V and about 3.3V; a second supply rail; an input stage coupled between that first and second supply rails that receives a differential input signal, wherein the input stage includes at least one differential input pair of complementary metal oxide semiconductor (CMOS) transistors; and a first output stage that is coupled to the input stage and to at least one of the first and second supply rails, wherein the first output stage includes a plurality of diode-connected transistors; a second output stage that is coupled between the first and second supply rails and to the first output stage, wherein the second output stage includes a first plurality of transistors; a third output stage that is coupled between the first and second supply rails and to the first and second output stages, wherein the third output stage includes a second plurality of transistors; and a pair of differential output terminals that are coupled to each of the second and third stages, wherein the pair of differential output terminals carry a differential current, and wherein the differential current travels in a first direction and is supplied through the second output stage when the differential input signal is in a first state, and wherein the differential current travels in a second direction and is supplied through the third output stage when the differential input signal is in a second state.

In accordance with a preferred embodiment of the present invention, the input stage further comprises a first NMOS transistor that is coupled to the first supply rail at its drain and that receives at least a portion of the differential input signal at its gate; a second NMOS transistor that is coupled to the first supply rail at its drain and the source of the first NMOS transistor at its source and that receives at least a portion of the differential input signal at its gate; and a current source that is coupled between the sources of the first and second NMOS transistors and the second supply rail.

In accordance with a preferred embodiment of the present invention, the input stage further comprises a third NMOS transistor that is coupled to at least one of the plurality of diode-connected transistors at its drain and to the drain of the first NMOS transistor at its gate; a fourth NMOS transistor that is coupled to at least one of the plurality of diode-connected transistors at its drain and to the drain of the second NMOS transistor at its gate; and a second current source that is coupled between the sources of the third and fourth NMOS transistors and the second supply rail.

In accordance with a preferred embodiment of the present invention, the first output stage further comprises a first diode-connected PNP transistor that is coupled to the first supply rail at its emitter and the first input stage at its base and collector; a second diode-connected PNP transistor that is coupled to the second supply rail at its emitter and the first input stage at its base and collector; a first current source that is coupled to the emitter and base of the first PNP transistor and the second supply rail; and a second current source that is coupled to the emitter and base of the second PNP transistor and the second supply rail.

In accordance with a preferred embodiment of the present invention, the second output stage further comprises a first PNP transistor that is coupled to the first supply rail at its emitter and the base of at least one of the plurality of diode-connected transistors at its base; and a second PNP transistor that is coupled to the first supply rail at its emitter, the base of the first PNP transistor at its base, and one of the differential output terminals at its collector; and a current mirror that is coupled to the collector of the first PNP transistor and one of the differential output terminals.

In accordance with a preferred embodiment of the present invention, the third output stage further comprises a first PNP transistor that is coupled to the first supply rail at its emitter and the base of at least one of the plurality of diode-connected transistors at its base; and a second PNP transistor that is coupled to the first supply rail at its emitter, the base of the first PNP transistor at its base, and one of the differential output terminals at its collector; and a current mirror that is coupled to the collector of the first PNP transistor and one of the differential output terminals.

In accordance with a preferred embodiment of the present invention, the differential output terminals further comprises a positive output terminal and a negative output terminal.

In accordance with a preferred embodiment of the present invention, the first direction of the differential current is a first current traveling into the apparatus through the positive output terminal and a second current traveling out of the apparatus through the negative output terminal.

In accordance with a preferred embodiment of the present invention, the second direction of the differential current is a first current traveling out of the apparatus through the positive output terminal and a second current traveling into the apparatus through the negative output terminal.

In accordance with a preferred embodiment of the present invention, an apparatus is provided. The apparatus comprises an input stage having: a first differential pair of CMOS transistors that receive a differential input signal; a second differential pair of CMOS transistors that are coupled to the first differential pair; a first output stage having a first diode-connected bipolar transistor and a second diode-connected bipolar transistor, wherein each of the first and second diode-connected bipolar transistors is coupled to one of CMOS transistors from the second differential pair; a second output stage having: a first set of bipolar transistors, wherein each bipolar transistor from the first set is coupled to the first diode-connected transistor at its base; and a first current mirror coupled that is coupled the collector of at least one of the bipolar transistors from the first set; and a third output stage having: a second set of bipolar transistors, wherein each bipolar transistor from the first set is coupled to the first diode-connected transistor at its base, wherein the collector of at least one bipolar transistor from the second set is coupled to the first current mirror; and a second current mirror coupled that is coupled the collector of at least one bipolar transistors from the first set and at least one bipolar transistor from the second set.

In accordance with a preferred embodiment of the present invention, the first output stage further comprises a first diode-connected PNP transistor that is coupled to at least one of the CMOS transistors at its base and collector; a second diode-connected PNP transistor that is coupled to at least one of the CMOS transistors at its base and collector; a first current source that is coupled to the emitter and base of the first PNP transistor; and a second current source that is coupled to the emitter and base of the second PNP transistor.

In accordance with a preferred embodiment of the present invention, the first set of bipolar transistors further comprises a first PNP transistor that is coupled to the base of at least one of the plurality of diode-connected bipolar transistors at its base and the first current mirror at its collector; and a second PNP transistor that is coupled to the base of the first PNP transistor at its base and the second current mirror at its collector.

In accordance with a preferred embodiment of the present invention, the second set of bipolar transistors further comprises a first PNP transistor that is coupled to the base of at least one of the plurality of diode-connected bipolar transistors at its base and the second current mirror at its collector; and a second PNP transistor that is coupled to the base of the first PNP transistor at its base and the first current mirror at its collector.

In accordance with a preferred embodiment of the present invention, an apparatus is provided. The apparatus comprises signal generating circuitry; and a plurality of low voltage differential signal (LVDS) drivers that are each coupled to the signal generating circuitry, wherein each LVDS driver includes: a positive input terminal that is coupled to the signal generating circuitry; a negative input terminal that is coupled the signal generating circuitry; a first supply rail having a voltage between about 1.8V and about 3.3V; a second supply rail; a positive output terminal; a negative output terminal; a first NMOS transistor that is coupled to the positive input terminal at its gate and the first supply rail at its drain; a second NMOS transistor that is coupled to the negative input terminal at its gate and the first supply rail at its drain; a first current source that is coupled between the sources of the first and second NMOS transistors and the second supply rail; a third NMOS transistor that is coupled to the drain of the first NMOS transistor at its gate; a fourth NMOS transistor that is coupled to the drain of the second NMOS transistor at its gate; a second current source that is coupled to the sources of the third and fourth NMOS transistors; a first PNP transistor that is coupled to the drain of the third NMOS transistor at its base and collector and the first supply rail at its emitter; a second PNP transistor that is coupled to the drain of the fourth NMOS transistor at its base and collector and the first supply rail at its emitter; a third current source that is coupled to the emitter and base of the first PNP transistor; a fourth current source that is coupled to the emitter and base of the second PNP transistor; a third PNP transistor that is coupled to the first supply rail at its emitter and the base of the first PNP transistor at its base; a fourth PNP transistor that is coupled to the first supply rail at its emitter, the base of the first PNP transistor at its base, and the negative output terminal at its collector; a first current mirror that is coupled to the second supply rail and the collector of the third PNP transistor and the positive output terminal; a fifth PNP transistor that is coupled to the first supply rail at its emitter and the base of the second PNP transistor at its base; a sixth PNP transistor that is coupled to the first supply rail at its emitter, the base of the second PNP transistor at its base, and the positive output terminal at its collector; and a second current mirror that is coupled to the second supply rail, the collector of the fifth PNP transistor, and the negative output terminal.

In accordance with a preferred embodiment of the present invention, the signal generating circuitry further comprises: a phase locked loop (PLL); and intermediate circuitry coupled between the PLL and each of the LVDS drivers.

In accordance with a preferred embodiment of the present invention, a method is provided. The method comprises receiving a differential signal by a differential input pair of CMOS transistor, wherein the differential input signal has a state; mirroring one of a first current and a second current, generated in a first output stage from a supply voltage between about 1.8V and about 3.3V, in a corresponding one of a second output stage and a third output stage based at least in part on the state of differential signal; and generating a differential current at a first output terminal and a second output terminal, wherein direction of the differential current is based at least in part on the state of the differential signal, and wherein the second and third output stages are coupled to each of first and second output terminals.

In accordance with a preferred embodiment of the present invention, the state of the differential signal further comprises a first state and a second state, and wherein the step of mirroring further comprises generating the first current in a first diode-connected bipolar transistor for the first state; mirroring the first current in the second output stage for the first state; generating the second current in a second diode-connected bipolar transistor in the second state; and mirroring the second current in the third output stage for the second state.

In accordance with a preferred embodiment of the present invention, the step of generating further comprises: generating the differential current in a first direction for the first state; and generating the differential current in a second direction for the second state.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
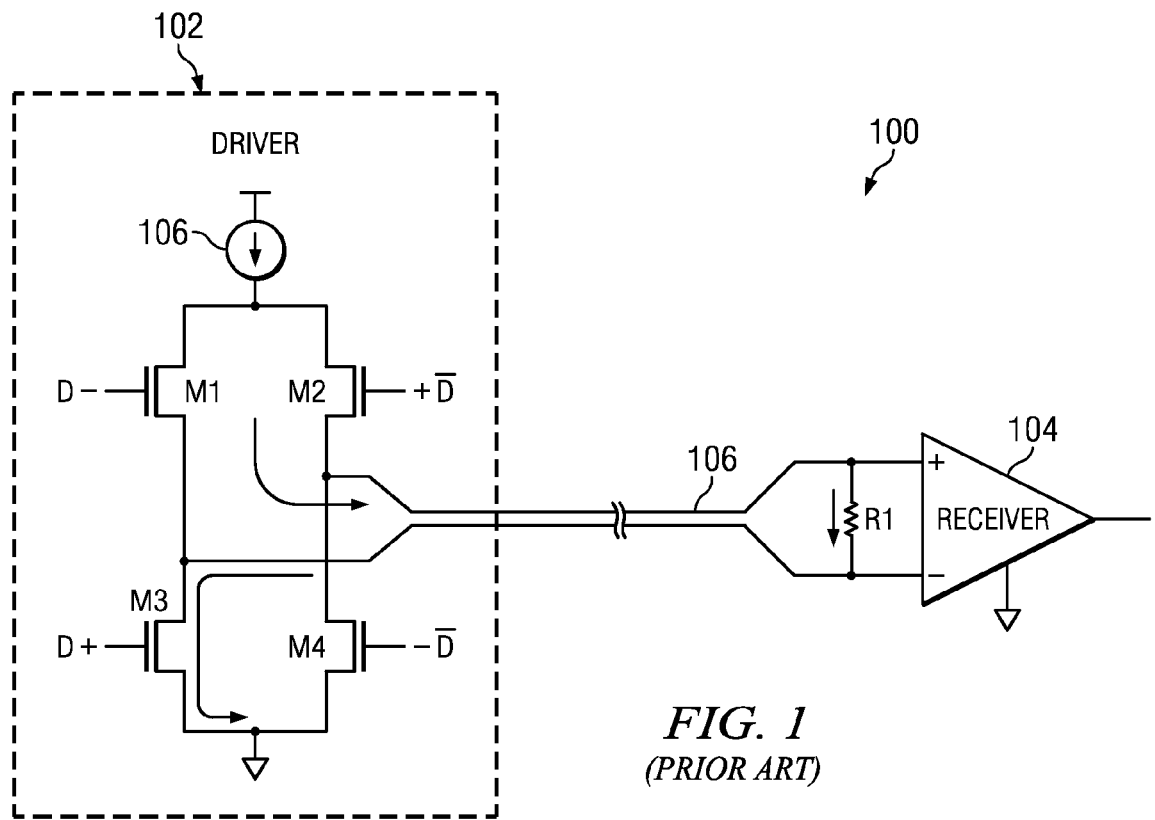
FIG. 1 is a block diagram of a conventional circuit using an LVDS driver with CMOS transistors.

Refer now to the drawings wherein depicted elements are, for the sake of clarity, not necessarily shown to scale and wherein like or similar elements are designated by the same reference numeral through the several views.

Figure 2:
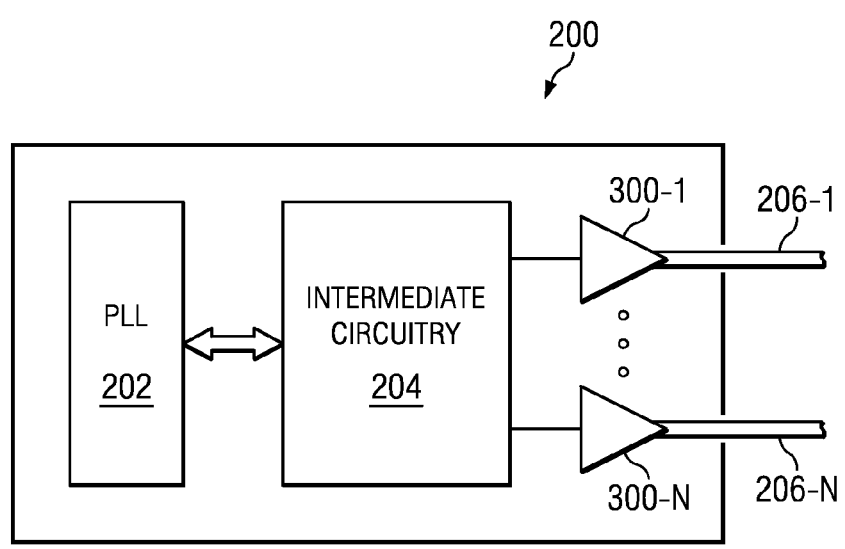
FIG. 2 is an example of a block diagram of a system in accordance with a preferred embodiment of the present invention.

Referring to FIG. 2 of the drawings, the reference numeral 200 generally designates a system in accordance with a preferred embodiment of the present invention. The system 200 generally comprises a phased locked loop (PLL) 202, intermediate circuitry 204, and drivers 300-1 to 300-N. PLL 202 can generally operate to provide one or more clock signals to intermediate circuit 204 (which can be comprised of a variety of different types of circuit). The intermediate circuitry 204 can then distribute signals to divers 300-1 to 300-N for transmission across differential transmission lines 206-1 to 206-N (respectively).

Figure 3:
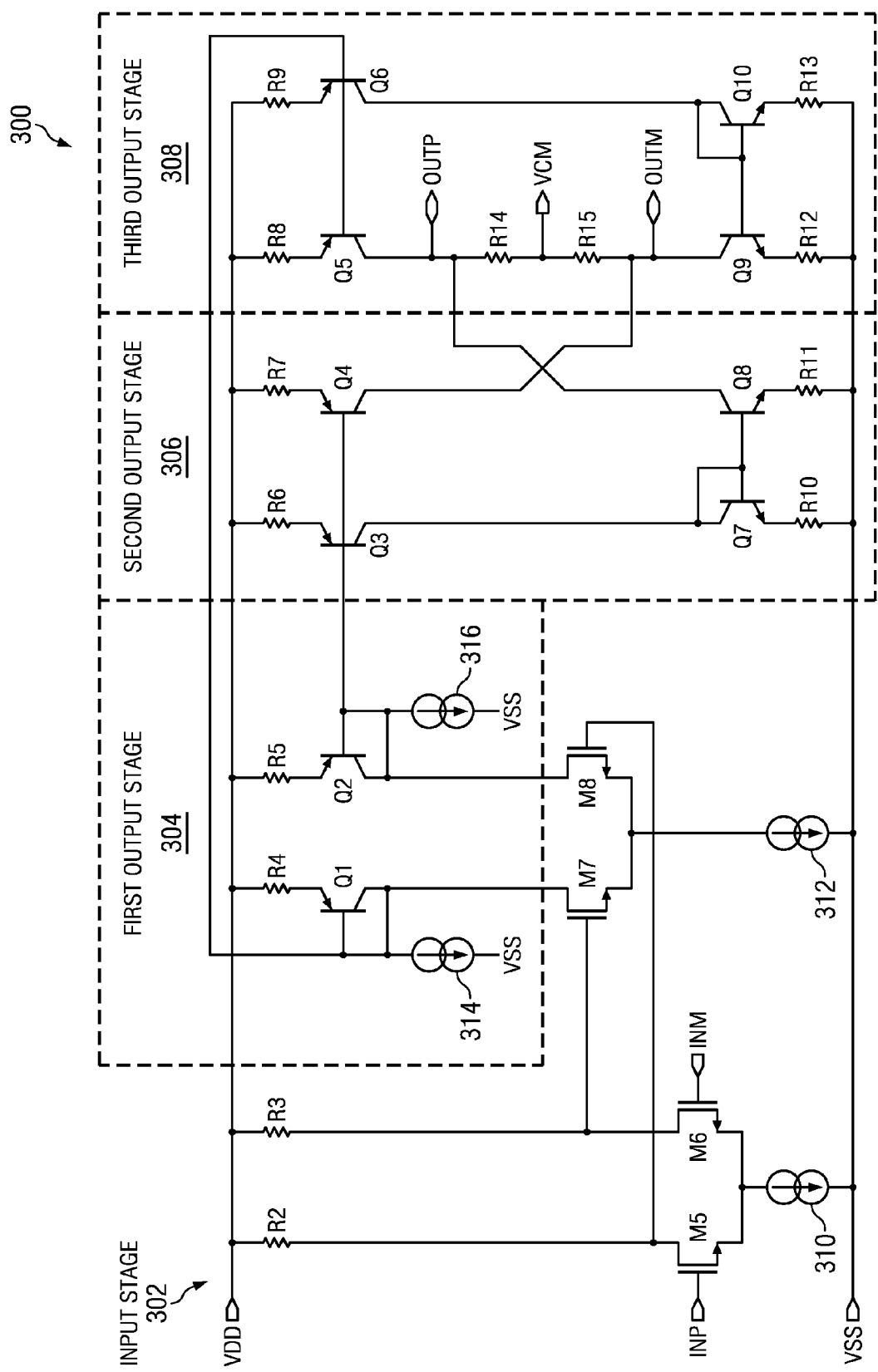
FIG. 3 is an example of a circuit diagram of the LVDS drivers of FIG. 2.

Turning to FIG. 3, an example of the drivers 300 (which is generally the same as each of drivers 300-1 to 300-N) can be seen. Driver 300 is generally divided into an input stage 302 and three output stage 304, 306, and 308. This driver 300 takes advantage of the characteristics of bipolar and CMOS transistors so that the supply voltage can be between about 1.8V and about 3.3V (which is provided on supply rail VDD). The input stage is generally comprised of differential input pairs of CMOS transistors M5/M6 and M7/M8, resistors R1 and R1, and current sources 310 and 312. The first input stage 304 is generally comprised of resistors R4 and R5, diode-connected PNP transistors Q1 and Q2, and current sources 314 and 316. The second input stage 306 is generally comprised of PNP transistors Q3 and Q4, resistors R5 and R6 and current mirror Q7, Q8, R10, and R11, and the third output stage 308 generally comprises resistors R8, R9, R14, and R15, transistors Q5 and Q6, and current mirror Q9, Q10, R12, and R13. Alternatively, transistors M5 and M6 can be replaced with bipolar transistors.

In operation, differential input signals are received by input terminals INM and INP so that an output signal having a differential current can be provided by or carried by output terminals OUTP and OUTM. The state of the differential signal (which does not need to be fully rail-to-rail for switching), as applied to terminals INM and INP, influences the direction of the differential current carried by terminals OUTP and OUTM. The relative currents carried by the terminals OUTP and OUTM generally comprise the differential current with the direction of the differential current being related to the relative directions carried by terminals OUTP and OUTM.

For a state of the differential input signal where a high signal is applied to input terminal INP and a low signal is applied to input terminal INM, a first current would travel out through terminal OUTP, and a second current would travel in through terminal OUTM. To accomplish this, the high and low signals are applied to the gates of NMOS transistors M5 and M6, respectively. As a result, high and low signals are respectively applied to the gates of transistors M7 and M8 (which are coupled to the drains of transistors M6 and M5, respectively). Current, then, flows through resistor R4 and diode-connected PNP transistor Q1, which is mirrored by PNP transistors Q5 and Q6. Because the collector of PNP transistor Q5 is coupled to terminal OUTP, the first current is carried out of the driver 300 by terminal OUTP. Additionally, because the collector of PNP transistor Q6 is coupled to the diode-connected NPN transistor Q10, the current mirrored by PNP transistor Q6 is provided to diode-connected NPN transistor Q10 and mirrored by NPN transistor Q9 (which is coupled to terminal OUTM at its collector), allowing the second current to be carried into the driver 300 by terminal OUTM.

Alternatively, for a state of the differential input signal where a low signal is applied to input terminal INP and a high signal is applied to input terminal INM, the first current would travel in through terminal OUTP, and the second current would travel out through terminal OUTM. To accomplish this, the high and low signals are applied to the gates of NMOS transistors M6 and M5, respectively. As a result, high and low signals are respectively applied to the gate of transistors M8 and M7. Current, then, flows through resistor R5 and diode-connected PNP transistor Q2, which is mirrored by PNP transistors Q3 and Q4. Because the collector of PNP transistor Q4 is coupled to terminal OUTM, the second current is carried out of the driver 300 by terminal OUTM. Additionally, because the collector of PNP transistor Q3 is coupled to the diode-connected NPN transistor Q7, the current mirrored by PNP transistor Q3 is provided to diode-connected NPN transistor Q7 and mirrored by NPN transistor Q8 (which is coupled to terminal OUTP at its collector), allowing the first current to be carried into the driver 300 by terminal OUTP.

As shown, driver 300 also includes several other features that enhance its operation. For example, current sources 314 and 316 are coupled to the gates and collectors of diode-connected PNP transistors Q1 and Q2, respectively. These current sources 316 and 314 (which are coupled to supply rail VSS that is typically at ground) are provided to allow a standing current to remain in transistors Q1 and Q2 (partially saturated), which, in turn, causes a quiescent current to remain in transistors Q3 to Q10. By providing current sources 314 and 316, small swing differential signals may be applied to transistors M7 and M8, and much more rapid switching can take place because of the partial saturation of transistors Q1 through Q10. Additionally, resistors R14 and R15 are coupled between terminals OUTP and OUTM so as to provide a common mode voltage to common mode terminal VCM.

As a result of the configuration of the driver 300, several advantages over conventional LVDS drivers can be realized. For example, in systems (such as system 200), there is better channel-to-channel isolation or reduced electromagnetic interference because of small-differential swings (which are generally not rail-to-rail) that generate minimal aggressor noise and because the fully-differential signaling is more immune to noise from adjacent channels. Additionally, there is lower additive jitter and less phase noise at a 1 MHz offset by avoiding the use of short-channel CMOS devices in a critical path. Moreover, driver 300 maintains a generally constant amplitude at high frequencies (i.e., up to 100 MHz).

Additionally, the supply voltage is scalable (generally down to about 1.8V), and the phase noise remains generally constant across the supply.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
 a first supply rail having a voltage between about 1.8V and about 3.3V;
 a second supply rail;
 an input stage coupled between that first and second supply rails that receives a differential input signal, wherein the input stage includes at least one differential input pair of complementary metal oxide semiconductor (CMOS) transistors; and
 a first output stage that is coupled to the input stage and to at least one of the first and second supply rails, wherein the first output stage includes a plurality of diode-connected transistors;
 a second output stage that is coupled between the first and second supply rails and to the first output stage, wherein the second output stage includes a first plurality of transistors;
 a third output stage that is coupled between the first and second supply rails and to the first and second output stages, wherein the third output stage includes a second plurality of transistors; and
 a pair of differential output terminals that are coupled to each of the second and third stages, wherein the pair of differential output terminals carry a differential current, and wherein the differential current travels in a first direction and is supplied through the second output stage when the differential input signal is in a first state, and wherein the differential current travels in a second direction and is supplied through the third output stage when the differential input signal is in a second state.

2. The apparatus of claim 1, wherein the input stage further comprises:
 a first NMOS transistor that is coupled to the first supply rail at its drain and that receives at least a portion of the differential input signal at its gate;
 a second NMOS transistor that is coupled to the first supply rail at its drain and the source of the first NMOS transistor at its source and that receives at least a portion of the differential input signal at its gate; and
 a current source that is coupled between the sources of the first and second NMOS transistors and the second supply rail.

3. The apparatus of claim 2, wherein the input stage further comprises:
 a third NMOS transistor that is coupled to at least one of the plurality of diode-connected transistors at its drain and to the drain of the first NMOS transistor at its gate;
 a fourth NMOS transistor that is coupled to at least one of the plurality of diode-connected transistors at its drain and to the drain of the second NMOS transistor at its gate; and a second current source that is coupled between the sources of the third and fourth NMOS transistors and the second supply rail.

4. The apparatus of claim 1, wherein the first output stage further comprises:
 a first diode-connected PNP transistor that is coupled to the first supply rail at its emitter and the first input stage at its base and collector;
 a second diode-connected PNP transistor that is coupled to the second supply rail at its emitter and the first input stage at its base and collector;
 a first current source that is coupled to the emitter and base of the first PNP transistor and the second supply rail; and
 a second current source that is coupled to the emitter and base of the second PNP transistor and the second supply rail.

5. The apparatus of claim 1, wherein the second output stage further comprises:
 a first PNP transistor that is coupled to the first supply rail at its emitter and the base of at least one of the plurality of diode-connected transistors at its base; and
 a second PNP transistor that is coupled to the first supply rail at its emitter, the base of the first PNP transistor at its base, and one of the differential output terminals at its collector; and
 a current mirror that is coupled to the collector of the first PNP transistor and one of the differential output terminals.

6. The apparatus of claim 1, wherein the third output stage further comprises:
 a first PNP transistor that is coupled to the first supply rail at its emitter and the base of at least one of the plurality of diode-connected transistors at its base; and
 a second PNP transistor that is coupled to the first supply rail at its emitter, the base of the first PNP transistor at its base, and one of the differential output terminals at its collector; and
 a current mirror that is coupled to the collector of the first PNP transistor and one of the differential output terminals.

7. The apparatus of claim 1, wherein the plurality of diode-connected transistors further comprises a plurality of diode-connected bipolar transistors, and wherein a first plurality of transistors further comprises a first plurality of bipolar transistors, and wherein the second plurality of transistors further comprises a second plurality of bipolar transistors.

8. The apparatus of claim 1, wherein the differential output terminals further comprises a positive output terminal and a negative output terminal.

9. The apparatus of claim 8, wherein the first direction of the differential current is a first current traveling into the apparatus through the positive output terminal and a second current traveling out of the apparatus through the negative output terminal.

10. The apparatus of claim 8, wherein the second direction of the differential current is a first current traveling out of the apparatus through the positive output terminal and a second current traveling into the apparatus through the negative output terminal.

11. An apparatus comprising:
 an input stage having:
  a first differential pair of CMOS transistors that receive a differential input signal;
  a second differential pair of CMOS transistors that are coupled to the first differential pair;
 a first output stage having a first diode-connected bipolar transistor and a second diode-connected transistor, wherein each of the first and second diode-connected bipolar transistors is coupled to one of CMOS transistors from the second differential pair;
  a second output stage having:
    a first set of bipolar transistors, wherein each bipolar transistor from the first set is coupled to the first diode-connected transistor at its base; and
    a first current mirror coupled that is coupled the collector of at least one of the bipolar transistors from the first set; and
  a third output stage having:
    a second set of bipolar transistors, wherein each bipolar transistor from the first set is coupled to the first diode-connected transistor at its base, wherein the collector of at least one bipolar transistor from the second set is coupled to the first current mirror; and
    a second current mirror coupled that is coupled the collector of at least one bipolar transistors from the first set and at least one bipolar transistor from the second set.

12. The apparatus of claim 11, wherein the first differential pair of CMOS transistors further comprises:
  a first NMOS transistor that receives at least a portion of the differential input signal at its gate;
  a second NMOS transistor that is coupled to the source of the first NMOS transistor at its source and that receives at least a portion of the differential input signal at its gate; and
  a current source that is coupled to the sources of the first and second NMOS transistors.

13. The apparatus of claim 12, wherein the second differential pair of CMOS transistors further comprises:
  a third NMOS transistor that is coupled to at least one of the plurality of diode-connected bipolar transistors at its drain and to the drain of the first NMOS transistor at its gate;
  a fourth NMOS transistor that is coupled to at least one of the plurality of diode-connected bipolar transistors at its drain and to the drain of the second NMOS transistor at its gate; and
  a second current source that is coupled to the sources of the third and fourth NMOS transistors.

14. The apparatus of claim 11, wherein the first output stage further comprises:
  a first diode-connected PNP transistor that is coupled to at least one of the CMOS transistors at its base and collector;
  a second diode-connected PNP transistor that is coupled to at least one of the CMOS transistors at its base and collector;
  a first current source that is coupled to the emitter and base of the first PNP transistor; and
  a second current source that is coupled to the emitter and base of the second PNP transistor.

15. The apparatus of claim 11, wherein the first set of bipolar transistors further comprises:
  a first PNP transistor that is coupled to the base of at least one of the plurality of diode-connected bipolar transistors at its base and the first current mirror at its collector; and
  a second PNP transistor that is coupled to the base of the first PNP transistor at its base and the second current mirror at its collector.

16. The apparatus of claim 11, wherein the second set of bipolar transistors further comprises:
  a first PNP transistor that is coupled to the base of at least one of the plurality of diode-connected bipolar transistors at its base and the second current mirror at its collector; and
  a second PNP transistor that is coupled to the base of the first PNP transistor at its base and the first current mirror at its collector.

17. An apparatus comprising:
signal generating circuitry; and
a plurality of low voltage differential signal (LVDS) drivers that are each coupled to the signal generating circuitry, wherein each LVDS driver includes:
  a positive input terminal that is coupled to the signal generating circuitry;
  a negative input terminal that is coupled the signal generating circuitry;
  a first supply rail having a voltage between about 1.8V and about 3.3V;
  a second supply rail;
  a positive output terminal;
  a negative output terminal;
  a first NMOS transistor that is coupled to the positive input terminal at its gate and the first supply rail at its drain;
  a second NMOS transistor that is coupled to the negative input terminal at its gate and the first supply rail at its drain;
  a first current source that is coupled between the sources of the first and second NMOS transistors and the second supply rail;
  a third NMOS transistor that is coupled to the drain of the first NMOS transistor at its gate;
  a fourth NMOS transistor that is coupled to the drain of the second NMOS transistor at its gate;
  a second current source that is coupled to the sources of the third and fourth NMOS transistors;
  a first PNP transistor that is coupled to the drain of the third NMOS transistor at its base and collector and the first supply rail at its emitter;
  a second PNP transistor that is coupled to the drain of the fourth NMOS transistor at its base and collector and the first supply rail at its emitter;
  a third current source that is coupled to the emitter and base of the first PNP transistor;
  a fourth current source that is coupled to the emitter and base of the second PNP transistor;
  a third PNP transistor that is coupled to the first supply rail at its emitter and the base of the first PNP transistor at its base;
  a fourth PNP transistor that is coupled to the first supply rail at its emitter, the base of the first PNP transistor at its base, and the negative output terminal at its collector;
  a first current mirror that is coupled to the second supply rail and the collector of the third PNP transistor and the positive output terminal;
  a fifth PNP transistor that is coupled to the first supply rail at its emitter and the base of the second PNP transistor at its base;
  a sixth PNP transistor that is coupled to the first supply rail at its emitter, the base of the second PNP transistor at its base, and the positive output terminal at its collector; and
  a second current mirror that is coupled to the second supply rail, the collector of the fifth PNP transistor, and the negative output terminal.

18. The apparatus of claim 17, wherein the signal generating circuitry further comprises:
- a phase locked loop (PLL); and
- intermediate circuitry coupled between the PLL and each of the LVDS drivers.

19. A method comprising:
- receiving a differential signal by a differential input pair of CMOS transistor, wherein the differential input signal has a state;
- mirroring one of a first current and a second current, generated in a first output stage from a supply voltage between about 1.8V and about 3.3V, in a corresponding one of a second output stage and a third output stage based at least in part on the state of differential signal; and
- generating a differential current at a first output terminal and a second output terminal, wherein direction of the differential current is based at least in part on the state of the differential signal, and wherein the second and third output stages are coupled to each of first and second output terminals.

20. The method of claim 19, wherein the state of the differential signal further comprises a first state and a second state, and wherein the step of mirroring further comprises:
- generating the first current in a first diode-connected bipolar transistor for the first state;
- mirroring the first current in the second output stage for the first state;
- generating the second current in a second diode-connected bipolar transistor in the second state; and
- mirroring the second current in the third output stage for the second state.

21. The method of claim 20, wherein the step of generating further comprises:
- generating the differential current in a first direction for the first state; and
- generating the differential current in a second direction for the second state.

\* \* \* \* \*